US006674135B1

(12) United States Patent
Cheek et al.

(10) Patent No.: US 6,674,135 B1
(45) Date of Patent: Jan. 6, 2004

(54) SEMICONDUCTOR STRUCTURE HAVING ELEVATED SALICIDED SOURCE/DRAIN REGIONS AND METAL GATE ELECTRODE ON NITRIDE/OXIDE DIELECTRIC

(75) Inventors: Jon Cheek, Round Rock, TX (US); Derick Wristers, Austin, TX (US); Mark I. Gardner, Cedar Creek, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/199,666

(22) Filed: Nov. 25, 1998

(51) Int. Cl.[7] .............................................. H01L 29/76
(52) U.S. Cl. ........................ 257/408; 257/344; 257/384
(58) Field of Search ................................. 257/366–339, 257/344–346, 408–411, 382–384; 438/300–306

(56) References Cited

U.S. PATENT DOCUMENTS

| 4,654,828 | A | * | 3/1987 | Hagiwara et al. ............ 257/410 |
| 5,663,570 | A | * | 9/1997 | Reedy et al. ................. 257/347 |
| 5,856,693 | A | * | 1/1999 | Onishi .......................... 257/382 |
| 5,866,460 | A | * | 2/1999 | Akram et al. ................ 438/306 |
| 5,908,313 | A | * | 6/1999 | Chau et al. .................. 438/299 |
| 5,970,352 | A | * | 10/1999 | Shiozawa et al. ........... 438/300 |
| 6,004,878 | A | * | 12/1999 | Thomas et al. .............. 438/655 |

* cited by examiner

Primary Examiner—Tom Thomas
Assistant Examiner—Orl Nadav

(57) ABSTRACT

A semiconductor structure an a process for its manufacture. First and second gate dielectric layers are formed on a semiconductor substrate between nitride spacers, and a metal gate electrode is formed on the gate dielectric layers. Lightly-doped drain regions and source/drain regions are disposed in the substrate and aligned with the electrode and spacers. A silicide contact layer is disposed over an epitaxial layer on the substrate over the source/drain regions. The metal gate electrode is aligned using a polysilicon alignment structure, which permits high temperature processing before the metal is deposited.

19 Claims, 2 Drawing Sheets

SEMICONDUCTOR STRUCTURE HAVING ELEVATED SALICIDED SOURCE/DRAIN REGIONS AND METAL GATE ELECTRODE ON NITRIDE/OXIDE DIELECTRIC

FIELD OF THE INVENTION

The present invention is directed generally to semiconductor structures and, more particularly, to a metal gate electrode formed in combination with elevated salicided source/drain regions.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

A typical MOS semiconductor device generally includes a gate electrode, which acts as a conductor, to which an input signal is typically applied via a gate terminal. Heavily doped source/drain regions are formed in a semiconductor substrate and are respectively connected to source and drain terminals. A channel region is formed in the semiconductor substrate beneath the gate electrode and separates the source/drain regions. The channel is typically lightly doped with a dopant type opposite that of the source/drain regions. The gate electrode is physically separated from the semiconductor substrate by a gate insulating layer, typically an oxide layer such as $SiO_2$. The insulating layer is provided to prevent current from flowing between the gate electrode and the source/drain regions or channel region.

In operation, an output voltage is typically developed between the source and drain terminals. When an input voltage is applied to the gate electrode, a transverse electric field is set up in the channel region. By varying the transverse electric field, it is possible to modulate the conductance of the channel region between the source region/drain regions. In this manner an electric field controls the current flow through the channel region. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate ever increasing numbers of such devices into a single silicon wafer. As the semiconductor devices are scaled down (i.e., made smaller) and in order to form a larger number of devices on a given surface area, the structure of the devices and fabrication techniques used to make such devices must be altered.

Several objectives influence MOSFET design and fabrication. First, there is a desire to reduce the dimensions of the MOSFET. Increasing the number of individual MOSFETs that can be placed onto a single silicon chip or die produces increased functionality per chip. Second, there is a continual desire to improve performance, and particularly the speed, of the MOSFET transistors. This pursuit is manifested in shorter conduction channel lengths and in efforts to obtain low contact at the MOSFET junctions. These aspects offer increased MOSFET speed and allow for a greater number of operations to be performed by the MOSFET in less time. MOSFETs are used in great quantity in computers where the push to obtain higher operation cycle speeds demands faster MOSFET performance. Lastly, there exists a constant need to minimize costly MOSFET fabrication steps.

Many prior MOSFETs designs have metal gate electrodes. However, with the challenges that accompany submicron gate alignment and modern high-temperature processing, metal gate electrodes have often been replaced with polysilicon gate electrodes. One difficulty faced in making semiconductor structures having metal gates is that the melting point of the metal is below the temperatures applied to the structure during high temperature thermal annealing which is used for various purposes during fabrication. Polysilicon, in contrast, has a much higher melting point. Thus, polysilicon is often used for gate electrodes. However, metal is desirable because of its conductivity and its ability to produce a stronger electric field.

Conventional approaches have encountered difficulty trying to maintain performance in the face of decreasing size and increasing density of devices. In attempting to overcome these hurdles, it is equally desirable to keep costly processing steps to a minimum. Therefore, it is desirable to provide a semiconductor structure and provide a process for its manufacture to address the above identified problems.

SUMMARY OF THE INVENTION

Generally, the present invention relates to a semiconductor structure and a process for its manufacture. In one embodiment, a semiconductor structure is provided. The semiconductor structure comprises first and second gate dielectric layers formed on a semiconductor substrate between nitride spacers. A metal gate electrode is formed on the gate dielectric layers, along with lightly-doped drain regions and source/drain regions are disposed in the substrate and aligned with the electrode and spacers. A silicide contact layer is disposed over an epitaxial layer on the substrate over the source/drain regions. The metal gate electrode is aligned using a polysilicon alignment structure, which permits high temperature processing before the metal is deposited.

In another embodiment, a process is provided for manufacturing a semiconductor structure. The process comprises forming a polysilicon alignment structure on a substrate. The polysilicon alignment structure permits high temperature processing before a metal for a gate electrode is deposited. A first concentration of a first dopant species is implanted into the substrate at a first energy level, whereby lightly doped drain regions are formed in the substrate and aligned with the alignment structure. Nitride spacers are formed on sides of the alignment structure, and a second concentration of a second dopant species is implanted into the substrate at a second energy level, whereby source and drain regions are formed in the substrate and aligned with the alignment structure. Adjacent to the spacers, an epitaxial layer is grown on the substrate, and the polysilicon alignment structure is thereafter removed, thereby forming a trench between the spacers. First and second gate dielectric layers are formed in the trench, and a silicide layer is formed on the epitaxial layer. Lastly, a metal gate electrode is formed in the trench.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
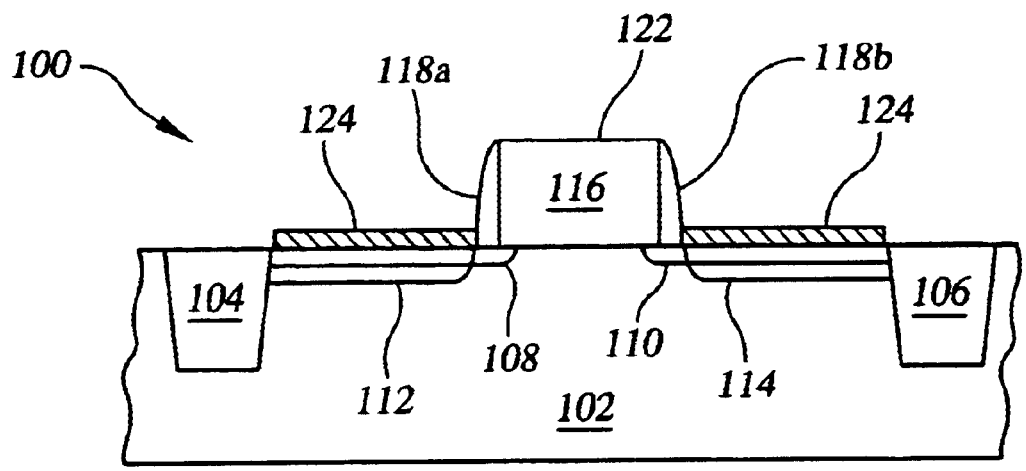
FIG. 1 is a partial cross-sectional view of an example semiconductor structure including a substrate upon which a polysilicon alignment structure, isolation trenches, LDD implants, and source/drain regions have been formed.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of semiconductor transistor arrangements. The invention has been found to be particularly advantageous in applications where trench isolation is desirable, such as in PMOS, NMOS, CMOS, and BiCMOS devices. While the present invention is not so limited, an appreciation of various aspects of the invention is best gained through a discussion of various application examples of processes used to form such semiconductor devices.

The invention has as one example aspect, the formation of a metal gate electrode in a semiconductor structure. One difficulty faced in making semiconductor structures having metal gates is that the melting point of the metal is below the temperatures applied to the structure during thermal annealing which is used in making silicide contact layers. Polysilicon, in contrast, has a much higher melting point. Thus, polysilicon is often used for gate electrodes. Metal is desirable because of its conductivity and its ability to produce a stronger electric field.

FIGS. 1–4 illustrate semiconductor structures at various stages in a process flow in accordance with example. embodiments of the invention. FIG. 1 is a partial cross-sectional view of an example semiconductor structure 100 including a substrate 102 upon which isolation trenches 104 and 106, LDD implants 108 and 110, and source/drain regions 112 and 114 have been formed. In an example CMOS embodiment, the substrate 102 is a p+ silicon bulk which incorporates p-well and n-well regions. The well formation process is suitably accomplished by implanting selected impurity distributions into the appropriate well regions in conjunction with conventional masking steps. For example, for p-well regions ions of boron are implanted, and for n-well regions ions of phosphorous are implanted.

The structure 100 also includes a polysilicon region 116 and spacers 118a and 118b. The polysilicon region 116 and spacers 118a–b are used in aligning the lightly-doped drain (LDD) regions 108 and 110 and source/drain regions 112 and 114, and in creating a trench for a subsequently deposited metal gate electrode. Polysilicon is used in the formation of the implant regions 108–114 because it is not susceptible to damage from high temperatures during rapid thermal annealing (RTA). The structure 100 is formed in accordance with the following example process sequence.

A photo-resist mask pattern (not shown) is formed on the substrate 102 to pattern the trenches 104 and 106. The trenches 104 and 106 are then formed by etching the silicon substrate 102 to a desired depth using a plasma anisotropic etch process in which the plasma contains fluorine or chlorine. The photo-resist material is then stripped, and the resulting trenches 104 and 106 are filled in accordance with conventional processes. It will be appreciated that both shallow trench isolation LOCOS isolation are compatible with the present invention.

After the trenches 104 and 106 are formed and filled, a layer (not shown) of polysilicon is deposited on the substrate 102. The deposition is accomplished by blanket depositing polysilicon in a chemical vapor deposition process, for example. Because the polysilicon is used only for alignment of a metal gate to be subsequently deposited, doping the polysilicon is unnecessary. A photo-resist mask pattern (not shown) is formed over the polysilicon layer to pattern the polysilicon region 116. The polysilicon is then etched, leaving region 116, and the photo-resist material is stripped.

After the polysilicon region 116 is formed, the LDD regions 108 and 110 are formed implanting ions having a concentration in the range of approximately 8E14 to 3E15 ions/cm$^2$, and the implant energy in the range of approximately 0.5 keV to 5 keV. The first dopant species may be ions of boron, phosphorus, or arsenic, for example. The LDD implant regions 108 and 110 are aligned with the polysilicon region 116.

Following the LDD implant, the LDD regions are activated with an RTA. For example, the RTA may involve temperatures in the range of approximately 950°–1060° C. applied for a period of approximately 6 to 30 seconds. It will be appreciated that the polysilicon region 116 is not adversely affected by the temperatures of the RTA, whereas if metal were present, it would melt or evaporate.

The spacers. 118a–b are nitride and are formed following the LDD implant. In a first stage, spacer material is deposited over the entire semiconductor structure. The spacer material is then removed using, for example, an anisotropic etch, leaving spacers 118a–b.

The spacers 118a–b are nitride and are formed following the LDD implant. In a first stage, spacer material is deposited over the entire semiconductor structure. The spacer material is then removed using, for example, an anisotropic etch, leaving spacers 118a–b.

After formation of the spacers 118a–b, the source/drain regions 112 and 114 are implanted in alignment therewith. The dopant species used to form the source drain regions may be ions of boron, phosphorus, or arsenic, for example, implanted at an energy level that ranges from approximately 5 keV to 60 keV and an ion concentration of approximately 2E15–6 E15 ions/cm$^2$.

Following the LDD implant, the LDD regions are activated with an RTA. For example, the RTA may involve temperatures in the range of approximately 950°–1060° C. applied for a period of approximately 6 to 30 seconds.

An epitaxial layer 124, for example 100–200 Å thick, is selectively grown on the substrate 102, whereby silicon is grown only on the crystalline silicon. That is, the epitaxial layer is not grown over the trenches 104 and 106, nor is it grown over the polysilicon region 116. A silicide sequence, which consumes silicon is used later in the process described herein. Thus, the thickness of the epitaxial layer 124 depends upon the thickness of silicon consumed in the silicide sequence.

Figure 2:
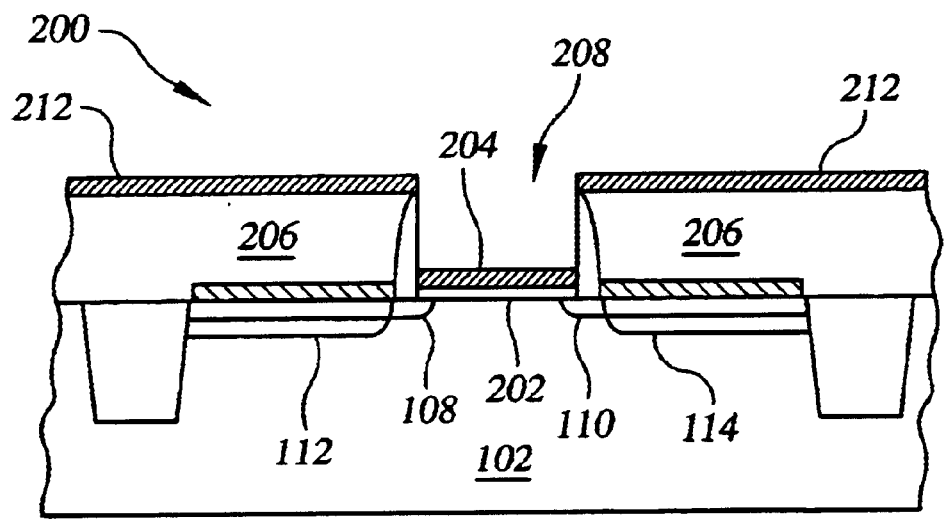
FIG. 2 is a partial cross-sectional view of a semiconductor structure having gate dielectric layers.

FIG. 2 is a partial cross-sectional view of a semiconductor structure 200 having gate dielectric layers 202 and 204. Following the process sequence described in conjunction with FIG. 1, a layer of oxide 206 is deposited on the substrate 102 and over the polysilicon region 116 (FIG. 1), and the oxide layer is planarized with the upper surface 122 (FIG. 1) of the polysilicon region. The polysilicon region 112 is etched, for example using a plasma anisotropic etch or a wet etch that is highly selective to polysilicon. Removal of the polysilicon leaves trench 208 which is aligned with the LDD regions 108 and 110 and the source/drain regions 112 and 114.

A gate oxide, for example, is grown at the base of the trench 208 to an implementation selected depth. The gate oxide forms the gate dielectric layer 202.

After forming the gate dielectric layer 202, a nitride layer 212 is deposited on the oxide layer 206 and in the trench 208. It will be appreciated that the second gate dielectric layer 204 is formed from deposition of the nitride layer 212. The nitride layer 212 is approximately 30 Åthick and is formed, for example, using a sputter deposition process. Sputtering nitride typically involves making a plasma solution of nitrogen gas to provide ionized nitrogen atoms, and accelerating the atoms toward a silicon target, thereby depositing the silicon nitride by product on the surface of the substrate. The sputtered deposition process advantageously provides a very slow deposition rate and allows for enhanced control over the thickness of the deposition nitride layer 212. Moreover, the sputter nitride deposition process is typically a room temperature process. For example, the chamber used in the sputtering process operates at room temperature and at about 10E-8 torr core pressure. In another embodiment, a nitride layer is formed in-situ with formation of the gate oxide layer 202. The in-situ deposition of the nitride layer 212 with the previously formed gate oxide 202 typically involves purging the sputter deposition chamber and changing the plasma solution to a nitrogen plasma solution and changing the sputter deposition target to a silicon target.

Figure 3:
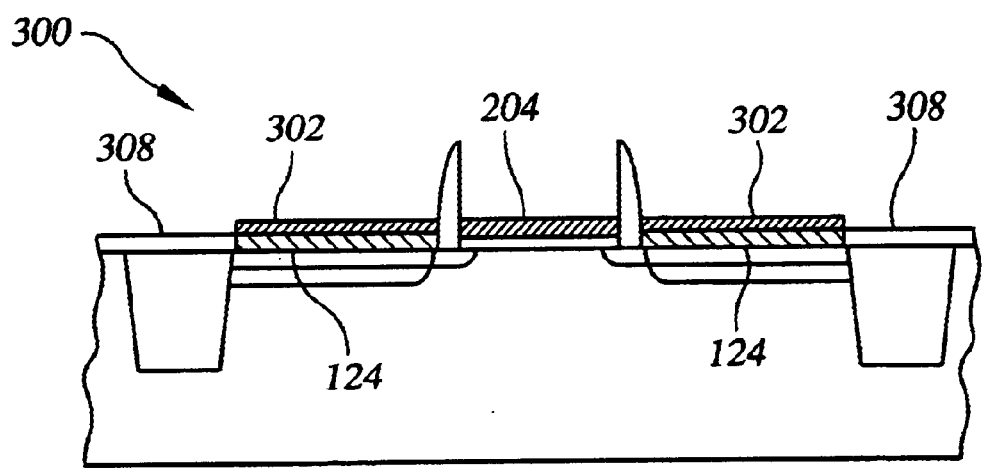
FIG. 3 is a partial cross-sectional view of a semiconductor structure having a silicide layer formed over the source/drain regions.

FIG. 3 is a partial cross-sectional view of a semiconductor structure 300 having a silicide layer 302 formed over the source/drain regions 112 and 114. In making the structure 300 of FIG. 3, a layer of oxide (not shown) is first deposited over the structure 200 shown in FIG. 2 and planarized with the nitride layer 212 (FIG. 2), thereby filling the gate trench 208 (FIG. 2) with oxide. Then, the oxide layer (not shown), the nitride layer 212 (FIG. 2), and the oxide layer 206 (FIG. 2) are etched, leaving exposed the nitride layer 204 in the trench and an oxide layer 308 over the isolation trenches 104 and 106.

After the nitride layer 204 and oxide layer 308 are formed, a silicide metal, for example, Ti, is blanket deposited in the trench 208 and over the epitaxial layer 124 and oxide layer 308 using conventional processes. An example thickness of the deposited Ti is 800 Å. The resultant structure is then subjected to a rapid thermal anneal to react the Ti with silicon in order to form the TiSi$_2$ layer 302. For example, the RTA may involve temperatures in the range of approximately 600°–800° C. applied for a period of approximately 10 to 60 seconds.

After the RTA, the unreacted Ti is removed with a conventional Ti etch process. That is, the Ti etch is selective to the TiSi$_2$ layer 302, which as shown in structure 300 remains after the etch. In other embodiments, metals such as cobalt or nickel could be used in making the silicide layers.

Figure 4:
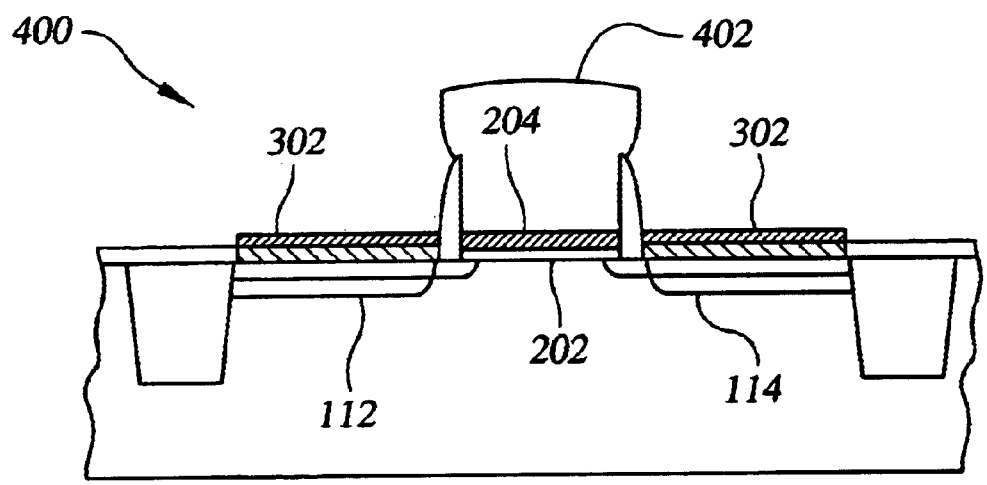
FIG. 4 is a partial cross-sectional view of a semiconductor structure with a metal gate electrode, in accordance with an example embodiment of the invention.

FIG. 4 is a partial cross-sectional view of a semiconductor structure 400 with a metal gate electrode 402, in accordance with an example embodiment of the invention. The embodiment of FIG. 4 includes two gate dielectric layers, 202 and 204. In another embodiment, the nitride gate dielectric layer 204 could be removed before forming the metal gate electrode 402. However, leaving the nitride layer 204 helps maintain the integrity of the gate oxide layer 202. For example, the insulative properties are maintained even with repeated applications of a transverse electric field. The nitride layer seals the oxide layer from the etch and minimizes penetration of boron.

In making the structure 400, a tungsten layer (not shown) is deposited for formation of the gate electrode 402. The tungsten layer is then masked and etched using conventional techniques. It will be appreciated that other metals, for example, aluminum and titanium could be used instead of tungsten.

Standard processing techniques are then used to complete formation of an integrated circuit. For example, an inter-level dielectric layer is deposited, source and drain contacts are formed, and transistor interconnections are formed.

It will be appreciated that the structure 400 includes the TiSi$_2$ layer 302 over the source/drain regions 112 and 114, along with a metal gate electrode. The TiSi$_2$ layer 302 promotes the formation of shallow junctions and low-ohmic contacts in the source/drain regions in the final device, and the metal gate electrode is desirable because of its conductivity and its ability to produce a stronger electric field.

As noted above, the present invention is applicable to fabrication of a number of different devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art upon review of the present specification. The claims are intended to cover such modifications and devices.

We claim:

1. A semiconductor structure, comprising:
   a substrate;
   a first gate dielectric layer formed on the substrate between nitride spacers;
   a second gate dielectric layer formed on the first gate dielectric layer;
   a metal gate electrode formed on the second gate dielectric layer;
   a pair of lightly-doped drain regions in the substrate adjacent to the spacers, wherein at least a portion of each of the lightly-doped drain regions is directly below the gate electrode;
   a pair of source/drain regions in the substrate adjacent to the spacers, wherein each of the source/drain regions is aligned with a respective one of the spacers;
   an epitaxial layer disposed on the substrate adjacent to the spacers; and
   a silicide layer disposed on the epitaxial layers.

2. The semiconductor structure of claim 1, wherein the first gate dielectric layer is an oxide layer.

3. The semiconductor structure of claim 1, wherein the second gate dielectric layer is a nitride layer.

4. The semiconductor structure of claim 1, wherein the metal is tungsten.

5. The semiconductor structure of claim 4, wherein the silicide layer is comprised of TiSi$_2$.

6. The semiconductor structure of claim 4, wherein the silicide layer is comprised of a compound selected from the group of titanium-silicide, cobalt-silicide, or nickel-silicide.

7. The semiconductor structure of claim 1, wherein the metal is selected from the group of aluminum, tungsten, and titanium.

8. The semiconductor structure of claim 1, further comprising a gate dielectric layer disposed between the metal gate electrode and the substrate.

9. The semiconductor structure of claim 1, wherein the metal gate electrode extends above the spacers.

10. The semiconductor structure of claim 1, wherein the silicide layer is comprised of $TiSi_2$.

11. The semiconductor structure of claim 2, wherein the second gate dielectric layer is a nitride layer.

12. The semiconductor structure of claim 11, wherein the metal is tungsten.

13. The semiconductor structure of claim 12, wherein the silicide layer is comprised of $TiSi_2$.

14. The semiconductor structure of claim 11, wherein the metal is selected from the group of aluminum, tungsten, and titanium.

15. The semiconductor structure of claim 11, wherein the silicide layer is comprised of a compound selected from the group of titanium-silicide, cobalt-silicide, or nickel-silicide.

16. The semiconductor structure of claim 15, wherein the metal is selected from the group of aluminum, tungsten, and titanium.

17. The semiconductor structure of claim 1, wherein the pair of source/drain regions are located below a horizontal plane that includes the interface between the first gate dielectric and the substrate.

18. A semiconductor structure comprising:

a substrate;

a first gate dielectric formed on the substrate;

a second gate dielectric formed on the first gate dielectric, separate from the first gate dielectric, and having a width about equal to the first gate dielectric;

a metal gate electrode formed on the second gate dielectric layer and having a width about equal to the first and second gate dielectrics;

nitride spacers formed on the substrate and adjacent each of the first and second gate dielectrics and the metal gate electrode;

a pair of lightly-doped drain regions in the substrate adjacent to and below the spacers, wherein at least a portion of each of the lightly-doped drain regions is directly below the gate electrode;

a pair of source/drain regions in the substrate adjacent to the spacers, wherein each of the source/drain regions is aligned with a respective one of the spacers and extend from a side of the spacer and horizontally away from the gate dielectrics and electrode, the source/drain regions being formed below a plane including an interface between the first gate dielectric and the substrate;

epitaxial layers disposed on the substrate, adjacent each of the spacers and extending away from the gate dielectrics and electrode; and a silicide layer disposed on the epitaxial layers.

19. A semiconductor structure having a gate structure formed on a substrate, the gate structure comprising:

a first gate dielectric formed on the substrate;

a second gate dielectric formed on the first gate dielectric, separate from the first gate dielectric, and having a width about equal to the first gate dielectric;

a metal gate electrode formed on the second gate dielectric layer and having a width about equal to the first and second gate dielectrics; and nitride spacers formed on the substrate and adjacent each of the first and second gate dielectrics and the metal gate electrode.

* * * * *

UNITED STATES PATENT AND TRADEMARK OFFICE
CERTIFICATE OF CORRECTION

PATENT NO. : 6,674,135 B1  Page 1 of 1
DATED : January 6, 2004
INVENTOR(S) : Cheek et al.

It is certified that error appears in the above-identified patent and that said Letters Patent is hereby corrected as shown below:

Title page,
Item [57], ABSTRACT,
Line 1, "an" should read -- and --.

Column 3,
Line 48, "example." should read -- example --.

Column 7,
Lines 7-9, claim 8 should be deleted.

Signed and Sealed this

Twenty-fourth Day of May, 2005

JON W. DUDAS
*Director of the United States Patent and Trademark Office*